(12) United States Patent
Tang

(10) Patent No.: US 12,396,156 B2
(45) Date of Patent: Aug. 19, 2025

(54) MEMORY STRUCTURE AND MANUFACTURING METHOD THEREOF, AND SEMICONDUCTOR STRUCTURE

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 571 days.

(21) Appl. No.: 17/817,134

(22) Filed: Aug. 3, 2022

(65) Prior Publication Data
US 2023/0380140 A1   Nov. 23, 2023

(30) Foreign Application Priority Data
May 19, 2022   (CN) .......................... 202210545501.2

(51) Int. Cl.
*H10B 12/00*   (2023.01)
*G11C 7/18*   (2006.01)
*G11C 8/14*   (2006.01)
*H10D 62/10*   (2025.01)

(52) U.S. Cl.
CPC ............... *H10B 12/30* (2023.02); *G11C 7/18* (2013.01); *G11C 8/14* (2013.01); *H10B 12/488* (2023.02); *H10D 62/106* (2025.01)

(58) Field of Classification Search
CPC .... H10B 12/488; H10B 12/482; H10B 12/03; H10B 12/30; H10D 62/106
See application file for complete search history.

(56) References Cited

U.S. PATENT DOCUMENTS

| 10,535,659 | B2 | 1/2020 | Kim et al. |
| 10,784,272 | B2* | 9/2020 | Lee ......................... H10B 12/30 |
| 2005/0211158 | A1* | 9/2005 | Hoshi ................... C30B 15/203 |
| | | | 257/E21.321 |
| 2008/0316809 | A1* | 12/2008 | Herner ................. G11C 13/003 |
| | | | 365/175 |
| 2016/0260663 | A1* | 9/2016 | Chen ...................... H10B 43/10 |

FOREIGN PATENT DOCUMENTS

| CN | 109616474 A | | 4/2019 |
| CN | 109841630 A | | 6/2019 |
| JP | H0864777 A | * | 3/1996 |
| KR | 20100038976 A | * | 4/2010 |

* cited by examiner

*Primary Examiner* — William B Partridge
*Assistant Examiner* — Felix B Andrews
(74) *Attorney, Agent, or Firm* — Kilpatrick Townsend & Stockton LLP

(57) ABSTRACT

The present disclosure relates to a memory structure and a manufacturing method thereof, and a semiconductor structure. The semiconductor structure includes an epitaxial structure, a grounding structure, a columnar capacitor structure, a bit line structure, and a word line structure. The grounding structure wraps one end of the epitaxial structure in a first direction; the columnar capacitor structure wraps the other end of the epitaxial structure in the first direction; the bit line structure surrounds the epitaxial structure, and is located between the grounding structure and the columnar capacitor structure; and the word line structure surrounds the epitaxial structure, and is located between the bit line structure and the columnar capacitor structure.

15 Claims, 9 Drawing Sheets

MEMORY STRUCTURE AND MANUFACTURING METHOD THEREOF, AND SEMICONDUCTOR STRUCTURE

CROSS-REFERENCE TO RELATED APPLICATION

This application claims the priority of Chinese Patent Application No. 202210545501.2, submitted to the Chinese Intellectual Property Office on May 19, 2022, the disclosure of which is incorporated herein in its entirety by reference.

TECHNICAL FIELD

The present disclosure relates to the technical field of design and manufacturing of integrated circuits, and in particular, to a memory structure and a manufacturing method thereof, and a semiconductor structure.

BACKGROUND

With continuous development of integrated circuit manufacturing processes, the market puts forward higher requirements for performance and reliability of semiconductor products. For semiconductor memory devices, the performance and reliability of transistors therein directly affect the storage performance and reliability of the products.

However, in conventional semiconductor memory devices, epitaxial silicon in field effect transistors has potential floating properties, and a current flowing through drains increases the potential of silicon epitaxial layers and increases channel conductance. As a drain voltage increases, a leakage current also increases to form unsaturated characteristics. At a high drain voltage, carriers near a drain terminal will generate avalanche multiplication, which makes the drain current increase rapidly with the drain voltage, resulting in an abnormal subthreshold slope and device threshold voltage drift, etc., such that not only device gains are reduced to cause unstable device operation, but also a drain breakdown voltage is reduced to cause a single-tube latch-up effect, resulting in disordered chip functions or circuit failure or even burnout.

SUMMARY

According to various embodiments of the present disclosure, a first aspect provides a semiconductor structure, including an epitaxial structure, a grounding structure, a columnar capacitor structure, a bit line structure, and a word line structure. The grounding structure wraps one end of the epitaxial structure in a first direction; the columnar capacitor structure wraps the other end of the epitaxial structure in the first direction; the bit line structure surrounds the epitaxial structure, and is located between the grounding structure and the columnar capacitor structure; and the word line structure surrounds the epitaxial structure, and is located between the bit line structure and the columnar capacitor structure. By sequentially arranging the grounding structure, the bit line structure, the word line structure, and the columnar capacitor structure on the epitaxial structure in an extension direction of the epitaxial structure, a shared epitaxial structure is grounded to prevent charges from accumulating in the epitaxial structure to produce a floating body effect, thereby improving the performance and reliability of semiconductor products.

According to some embodiments, a second aspect of the present disclosure provides a memory structure, including: a substrate, a first-type doped well region being formed in the substrate; an epitaxial layer, covering the first-type doped well region; and a target laminated structure, located on the epitaxial layer; where, the target laminated structure includes a plurality of laminated semiconductor structures in the embodiments of the present disclosure, and word line structures in adjacent two of the semiconductor structures are insulated from each other in a direction perpendicular to the substrate.

According to some embodiments, a third aspect of the present disclosure provides a method of manufacturing a memory structure, including: providing a substrate, a first-type doped well region being formed in the substrate; forming an epitaxial layer on the substrate, the epitaxial layer covering the first-type doped well region; and forming a target laminated structure on the epitaxial layer, the target laminated structure including a plurality of semiconductor structures laminated in a thickness direction according to any embodiment of the present disclosure.

BRIEF DESCRIPTION OF THE DRAWINGS

To describe the technical solutions in the embodiments of the present disclosure more clearly, the accompanying drawings required to describe the embodiments are briefly described below. Apparently, the accompanying drawings described below are only some embodiments of the present disclosure. Those of ordinary skill in the art may further obtain other accompanying drawings on these accompanying drawings without creative efforts.

FIG. 4 to FIG. 15B are schematic structural diagrams of different steps in a method of manufacturing a memory structure according to one embodiment of the present disclosure, where FIG. 4 to FIG. 13B are stereoscopic diagrams in different steps; FIG. 14 to FIG. 15A are stereoscopic diagrams of corresponding steps intercepted in a direction perpendicular to ox direction; FIG. 15B is a left view of FIG. 15A; oy direction is a first direction; ox direction is a second direction; and oz direction is a height/thickness direction.

DETAILED DESCRIPTION

Figure 1:
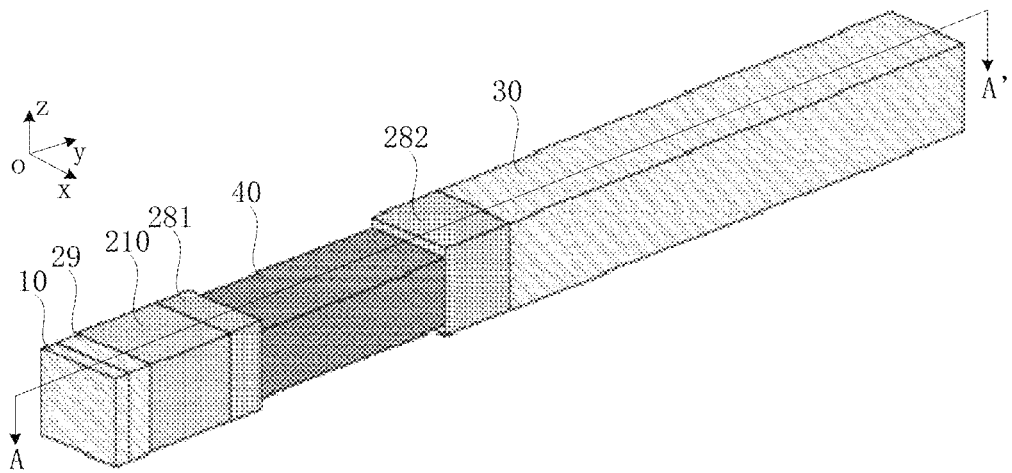
FIG. 1 is a stereoscopic diagram of a semiconductor structure according to one embodiment of the present disclosure.

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms used in the specification of the present disclosure are merely for the purpose of describing specific embodiments, rather than to limit the present disclosure.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers, doped types and/or sections, these elements, components, regions, layers, doped types and/or sections should not be limited by these terms. These terms are only used to distinguish one element, component, region, layer, doping type or section from another element, component, region, layer, doping type or section. Therefore, without departing from the teachings of the present application, a first element, component, region, layer, doping type or section discussed below may be a second element, component, region, layer, doping type or section. For example, the first doping type may be the second doping type, and similarly, the second doping type may be the first doping type; or the first doping type and the second doping type are different doping types, for example, the first doping type may be P-type and the second doping type may be N-type, or the first doping type may be N-type and the second doping type may be P-type.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In the specification, the singular forms of "a", "an" and "the/this" may also include plural forms, unless clearly indicated otherwise. It should also be understood that terms "include" and/or "comprise", when used in this specification, may determine the presence of features, integers, steps, operations, elements and/or components, but do not exclude the presence or addition of one or more other features, integers, steps, operations, elements, components and/or groups. In this case, in this specification, the term "and/or" includes any and all combinations of related listed items.

It should be noted that the mutual insulation between the two described in the embodiments of the present disclosure includes, but is not limited to, the existence of one or more of an insulating material, an insulating air gap, or a gap between the two.

It should be noted that, the drawings provided in the embodiments merely illustrate the basic concepts of the present disclosure schematically. Although the drawings only show components related to the present disclosure rather than being drawn according to the quantities, shapes, and sizes of components in actual implementation, patterns, quantities, and proportions of components in actual implementation may be changed randomly, and the component layout may be more complex.

The kink effect refers to non-saturated characteristics of a drain current and drain voltage of a field effect transistor. The production factor is that at a high drain voltage, carriers near a drain terminal will produce avalanche multiplication, which makes the drain current increase rapidly with the drain voltage. Epitaxial silicon in the field effect transistor has potential floating properties, and when a current flows through a forward-biased pn junction of a drain, the potential of a silicon epitaxy layer increases, and channel conductance also increases. Therefore, as the drain voltage increases, leakage current also increases to form unsaturated characteristics, or even cause disordered chip functions or circuit failure or even burnout.

The present disclosure aims to provide a memory structure and a manufacturing method thereof, and a semiconductor structure, to effectively avoid potential floating properties of epitaxial silicon in field effect transistors, and improve the performance and reliability of semiconductor products.

Figure 2:
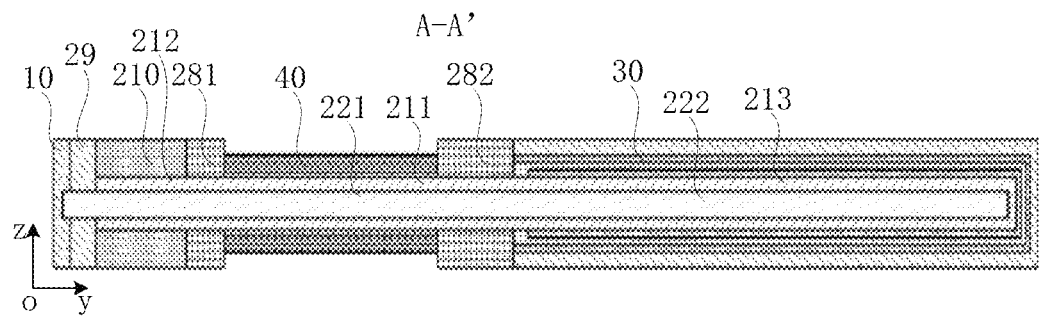
FIG. 2 is a schematic structural diagram of a cross section of a structure as shown in FIG. 1 along direction AA'.

In some embodiments of the present disclosure, please referring to FIG. 1 and FIG. 2, a semiconductor structure is provided. The semiconductor structure includes an epitaxial structure (not shown in FIG. 1), a grounding structure 10, a columnar capacitor structure 30, a bit line structure 210, and a word line structure 40. The grounding structure 10 wraps one end of the epitaxial structure in a first direction such as oy direction; the columnar capacitor structure 30 wraps the other end of the epitaxial structure in the first direction such as oy direction; the bit line structure 210 surrounds the epitaxial structure, and is located between the grounding structure 10 and the columnar capacitor structure 30; and the word line structure 40 surrounds the epitaxial structure, and is located between the bit line structure 210 and the columnar capacitor structure 30. By sequentially arranging the grounding structure 10, the bit line structure 210, the word line structure 40, and the columnar capacitor structure 30 on the epitaxial structure in the oy direction, a shared epitaxial structure is grounded to prevent charges from accumulating in the epitaxial structure to produce a floating body effect, thereby improving the performance and reliability of semiconductor products.

In some embodiments of the present disclosure, please still referring to FIG. 1 and FIG. 2, a cross section of the epitaxial structure intersecting with the first direction is in a rounded shape. For example, a cross section of the epitaxial structure perpendicular to the oy direction is in a rounded shape. The rounded shape includes at least one of a rounded rectangle, an ellipse, a rounded polygon, and a circle, and prevents a contact surface of the epitaxial structure with any one of the grounding structure 10, the bit line structure 210, the word line structure 40, and the columnar capacitor structure 30 formed on the epitaxial structure from having a sharp corner to induce a tip discharge/leakage phenomenon, thereby improving the performance and reliability of manufactured products.

In some embodiments of the present disclosure, please still referring to FIG. 1 and FIG. 2, a part of the epitaxial structure covered by the word line structure 40 includes: a first semiconductor pillar 221 extending in the oy direction and provided with a cross section, intersecting with the first direction, being in a rounded shape; and a first channel layer 211 surrounding the first semiconductor pillar 221 and located between the word line structure 40 and the first semiconductor pillar 221. For example, the cross section of the first semiconductor pillar 221 perpendicular to the oy direction is in a rounded angle, and the rounded angle includes at least one of rounded rectangle, an ellipse, a rounded polygon, and a circle. The word line structure 40 may be configured to include a gate oxide layer 41 and a gate metal layer 42 sequentially laminated from inside to outside. The first semiconductor pillar 221 is grounded via the grounding structure 10 to prevent the word line structure 40 from causing, under the action of an applied voltage, a floating body effect in the first semiconductor pillar 221, thereby improving the performance and reliability of semiconductor products. Since contact surfaces between the first channel layer 211 and the first semiconductor pillar 221 are rounded surfaces, and the cross section of the first channel layer 211 perpendicular to the oy direction is in a rounded shape, the tip discharge/leakage phenomenon is effectively avoided, thereby improving the performance and reliability of manufactured products. The gate oxide layer 41 may be made of a material with a high-k dielectric constant. For example, the material of the gate oxide layer 41 may include, but is not limited to, one or more of aluminum oxide ($Al_2O_3$), hafnium oxide ($HfO_2$), hafnium oxide nitrogen (HfON), zirconium oxide ($ZrO_2$), tantalum oxide ($Ta_2O_5$), titanium oxide ($TiO_2$), or strontium titanium oxide ($SrTiO_3$). The gate metal layer 42 may include, but is not limited to, any one or several of titanium nitride (TiN), titanium (Ti), tungsten silicide ($Si_2W$), and tungsten (W), etc.

In some embodiments of the present disclosure, please still referring to FIG. 1 and FIG. 2, the first channel layer 211 includes a first-type doped layer. A part of the epitaxial structure covered by the bit line structure 210 and a part of the epitaxial structure covered by the columnar capacitor structure 30 each include: a second semiconductor pillar 222 extending in the oy direction and provided with a cross section, intersecting with the first direction, being in a rounded shape; and a second-type doped layer including a first part located between the second semiconductor pillar 222 and the bit line structure 210, and a second part located between the second semiconductor pillar 222 and the columnar capacitor structure 30. For example, the cross section of the second semiconductor pillar 222 perpendicular to the oy direction is in a rounded angle, and the rounded angle includes at least one of rounded rectangle, an ellipse, a rounded polygon, and a circle. The first part of the second-type doped layer may be defined as a second channel layer 212, and the second part of the second-type doped layer may be defined as a third channel layer 213. The first channel layer 211, the second channel layer 212, and the third channel layer 213 form an initial channel layer. The second semiconductor pillar 222 and the first semiconductor pillar 221 form a target semiconductor layer. The target semiconductor layer and the initial channel layer surrounding an outer surface of the target semiconductor layer form an epitaxial structure. The bit line structure 210, the word line structure 40, and the columnar capacitor structure 30 share the epitaxial structure and are grounded via the grounding structure 10 to prevent charges from accumulating in the epitaxial structure to produce a floating body effect, thereby improving the performance and reliability of semiconductor products.

In some embodiments of the present disclosure, please still referring to FIG. 1 and FIG. 2, the first semiconductor pillar 221 and the second semiconductor pillar 222 are made of germanium-silicon; and the first channel layer 211 and the second-type doped layer are made of silicon, to form the word line structure 40 on the outer surface of the first channel layer 211 and form the bit line structure 210 and the columnar capacitor structure 30 respectively at two opposite ends of the second-type doped layer in the oy direction, so as to form memory cell structures sharing the epitaxial structure. The epitaxial structure is grounded via the grounding structure 10 to prevent charges from accumulating in the epitaxial structure to produce a floating body effect, thereby improving the performance and reliability of the memory cell structures. Moreover, the contact surface of the epitaxial structure with any one of the grounding structure 10, the bit line structure 210, the word line structure 40, and the columnar capacitor structure 30 formed on the epitaxial structure is a rounded surface to avoid a sharp corner from inducing a tip discharge/leakage phenomenon, thereby improving the performance and reliability of the memory cell structures.

In some embodiments of the present disclosure, please still referring to FIG. 1 and FIG. 2, the first-type doped layer has a doping concentration range of [1E14 cm-3, 1E18 cm-3]. For example, the first-type doped layer may be P-type, and P-type impurity ions may include, but are not limited to, one or more of boron (B) ions, gallium (Ga) ions, boron fluoride ($BF_2$) ions, and indium (In) ions. For example, the first channel layer 211 is a first-type doped layer, and the first-type doped layer may have a doping concentration of 1E14 cm-3, 1E15 cm-3, 1E16 cm-3, 1E17 cm-3, or 1E18 cm-3. For example, an in-situ doping process may control the doping concentration of the first-type doped layer as [1E14 cm-3, 1E18 cm-3], such that the gate controllability of the word line structure 40 is improved, and the conductive impedance and the energy consumption are reduced. The second-type doped layer has a doping concentration range of [1E18 cm-3, 1E21 cm-3], and the second-type doped layer may have a doping concentration of 1E18 cm-3, 1E19 cm-3, 1E20 cm-3, or 1E21 cm-3. The second-type doped layer may be N-type, and N-type impurity ions may include, but are not limited to, one or several of phosphorus (P) ions, arsenic (As) ions, and antimony (Sb) ions. For example, the in-situ doping process may control the doping concentration of the second-type doped layer as [1E18 cm-3, 1E21 cm-3], such that the conductive impedance and the energy consumption of the epitaxial structure are reduced.

In some embodiments of the present disclosure, please still referring to FIG. 1 and FIG. 2, a part of the epitaxial structure covered by the word line structure 40 has a thickness of [30 nm, 80 nm]. For example, the part of the epitaxial structure covered by the word line structure 40 may have a thickness of 30 nm, 35 nm, 45 nm, 55 nm, 65 nm, 75 nm, or 80 nm. In this embodiment, while ensuring the electrical performance of the word line structures 40, adjacent two of the word line structures 40 in a stacking direction such as oz direction are prevented from being insulated from each other. Every two of the ox direction, the oy direction, and the oz direction are perpendicular to each other.

In some embodiments of the present disclosure, please still referring to FIG. 1 and FIG. 2, the semiconductor structure further includes a bit line protection structure 281, a capacitor isolation structure 282, and a bit line isolation structure 29. The bit line protection structure 281 is located between the bit line structure 210 and the word line structure 40, such that the bit line structure 210 and the word line structure 40 are electrically isolated in the oy direction. The capacitor isolation structure 282 is located between the word line structure 40 and the columnar capacitor structure 30, such that the word line structure 40 and the columnar capacitor structure 30 are electrically isolated in the oy direction. The bit line isolation structure 29 surrounds the epitaxial structure, and is located between the grounding structure 10 and the bit line structure 210, such that the grounding structure 10 and the bit line structure 210 are electrically isolated in the oy direction.

In some embodiments, please still referring to FIG. 1 and FIG. 2, the grounding structure 10 is made of a metal conductive material and/or a non-metal conductive material; and/or, the bit line structure 210 is made of a metal conductive material. The metal conductive material includes, but is not limited to, one or more of cobalt (Co), nickel (Ni), titanium (Ti), tungsten (W), tantalum (Ta), tantalum titanium (TaTi), tungsten nitride (WN), copper (Cu), and aluminum (Al). The non-metal conductive material includes, but is not limited to, doped polycrystalline silicon.

Figure 3:
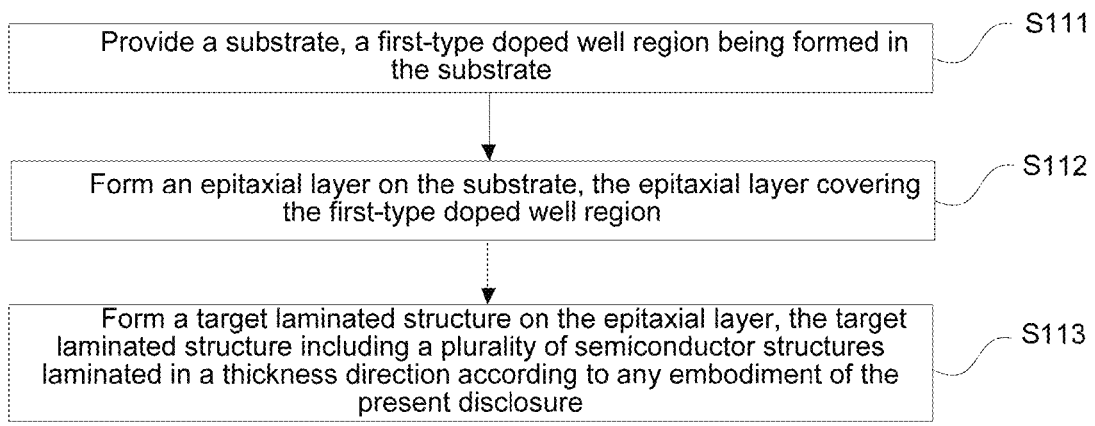
FIG. 3 is a schematic flowchart of a method of manufacturing a memory structure according to one embodiment of the present disclosure.

In some embodiments, please referring to FIG. 3, the present disclosure provides a method of manufacturing a memory structure, including:
- Step S111: provide a substrate, a first-type doped well region being formed in the substrate;
- Step S112: form an epitaxial layer on the substrate, the epitaxial layer covering the first-type doped well region; and
- Step S113: form a target laminated structure on the epitaxial layer, the target laminated structure including a plurality of semiconductor structures laminated in a thickness direction according to any embodiment of the present disclosure.

Figure 4:
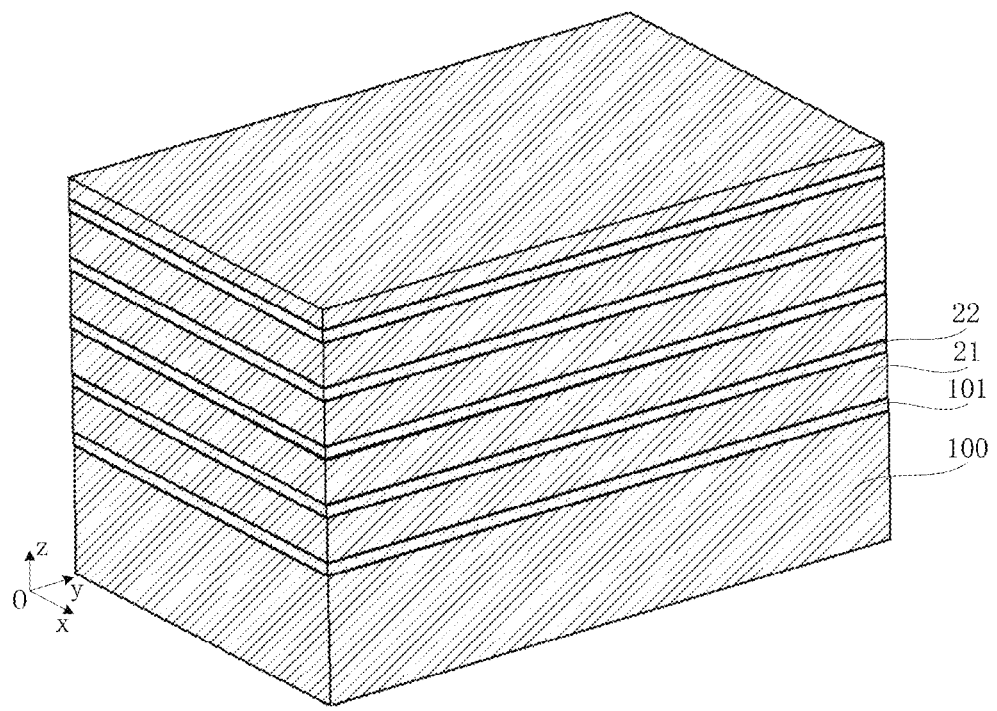

In some embodiments, please referring to FIG. 3 and FIG. 4, the substrate 100 is provided, and a first-type doped well region (not shown in the drawing) is formed in the substrate 100. The substrate may be made of a semiconductor material, an insulating material, a conductor material, or any combination thereof. The substrate 100 may be of a single-layer structure or a multi-layer structure. For example, the substrate 100 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. Alternatively, also for example, the substrate may be a layered substrate including, for example, Si/SiGe, Si/SiC, silicon-on-insulator (SOI), or silicon-germanium-on-insulator. Therefore, the type of the substrate should not limit the protection scope of the present disclosure. The P-type ions are implanted into the substrate 100 by using an ion implantation process to form the first-type doped well region (not shown in the drawing). The P-type ions may include, but are not limited to, one or several of boron (B) ions, gallium (Ga) ions, boron fluoride ($BF_2$) ions, and indium (In) ions. The doping concentration of the first-type doped well region in the substrate 100 may be [1E12 cm-3, 1E18 cm-3]. For example, the doping concentration of the first-type doped well region may be 1E12 cm-3, 1E13 cm-3, 1E14 cm-3, 1E15 cm-3, 1E16 cm-3, 1E17 cm-3, or 1E18 cm-3.

In some embodiments, please referring to FIG. 3 to FIG. 10, the process of forming a target laminated structure on the epitaxial layer 101 may include:
- Step S1131: form an initial laminated structure on the epitaxial layer 101, the initial laminated structure including initial channel layers 21 and target semiconductor layers 22 alternately laminated in sequence from bottom to top;
- Step S1132: form a plurality of isolation structures 24, extending in a first direction and arranged at intervals in a second direction, in the initial laminated structure, bottoms of the isolation structures 24 being in contact with an upper surface of the epitaxial layer 101;
- Step S1133: form a word line trench 25 extending in the second direction, side walls of the word line trench 25 being covered by a protective layer 26, the word line trench 25 exposing the upper surface of the epitaxial layer 101, and parts, located in the word line trench 25, of the target semiconductor layers 22 being suspended and exposed;
- Step S1134: remove an oxide formed in an in-situ oxidation period after the target semiconductor layers 22 exposed in the word line trench 25 are oxidized in situ, such that the target semiconductor layers 22 exposed in the word line trench 25 are rounded, a rounded part of each of the target semiconductor layers 22 forming a first semiconductor pillar 221; and
- Step S1135: form a first channel layer 211 on an outer surface of the first semiconductor pillar 221, the first channel layer 211 surrounding the first semiconductor pillar 221.

In some embodiments, please referring to FIG. 4, in step S1131, initial channel layers 21 and target semiconductor layers 22 alternately laminated in sequence in the oz direction may be formed on the epitaxial layer 101 by using the deposition process. The material of the initial channel layer 21 may include, but is not limited to, silicon (Si). The material of the target semiconductor layer 22 may include, but is not limited to, silicon-germanium (SiGe). The target semiconductor layer 22 made of silicon-germanium can completely transfer a silicon lattice of the substrate 100 into the laminated initial channel layer 21 made of silicon, thereby ensuring that each initial channel layer 21 made of silicon can have the same silicon lattice as the substrate 100. The deposition process may include, but is not limited to, one or more of a chemical vapor deposition (CVD), an atomic layer deposition (ALD) process, a high-density plasma (HDP) process, a plasma enhanced deposition process, and a spin-on dielectric (SOD) layer process. The initial channel layer 21 may have a thickness of [60 nm, 100 nm]. For example, the initial channel layer 21 may have a thickness of 60 nm, 70 nm, 80 nm, 90 nm, or 100 nm. The target semiconductor layer 22 may have a thickness of [5 nm, 20 nm]. For example, the target semiconductor layer 22 may have a thickness of 5 nm, 10 nm, 15 nm, or 20 nm. The target semiconductor layer 22 itself provides tensile stress, and each layer should not be too thick, otherwise problems such as body tilt are likely to occur. The target semiconductor layer 22 inevitably has defects during manufacturing, and increasing its thickness means increasing the probability and/or number of defect locations. If the target semiconductor layer 22 made of silicon-germanium is too thick and has too many defects, the lattice mismatch of the initial channel layer 21 on the top is likely to be more serious.

Figure 5:
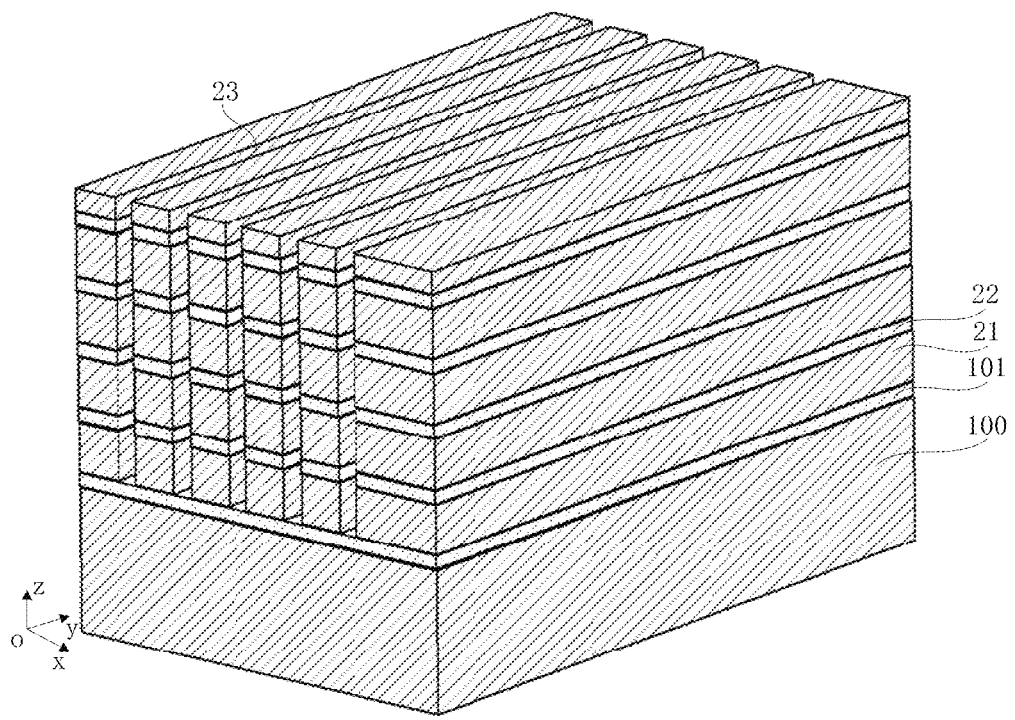
Figure 6:
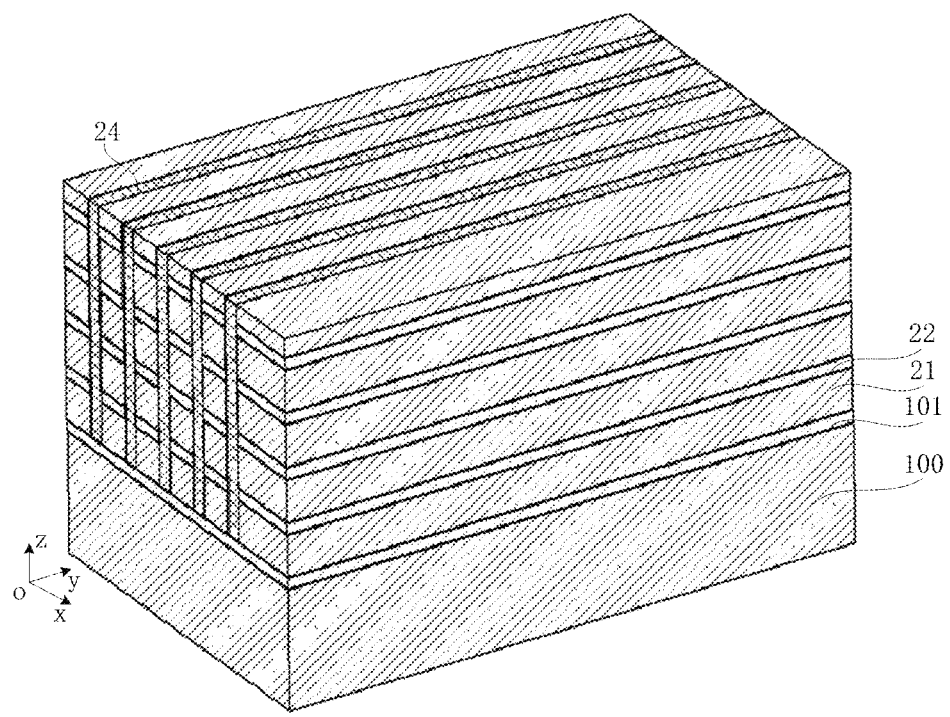

In some embodiments, please still referring to FIG. 5 and FIG. 6, in step S1132, a plurality of first trenches 23 extending in the first direction (such as oy direction) and arranged at intervals in the second direction (such as ox direction) may be formed in the initial laminated structure by using a wet etching process; and then, an isolation material is deposited in the first trenches 23 to form an isolation structure 24 in each of the first trenches 23. The bottoms of the isolation structures 24 are in contact with the upper surface of the epitaxial layer 101, facilitating mutual isolation of a plurality of subsequently manufactured bit line structures in the ox direction.

Figure 7A:
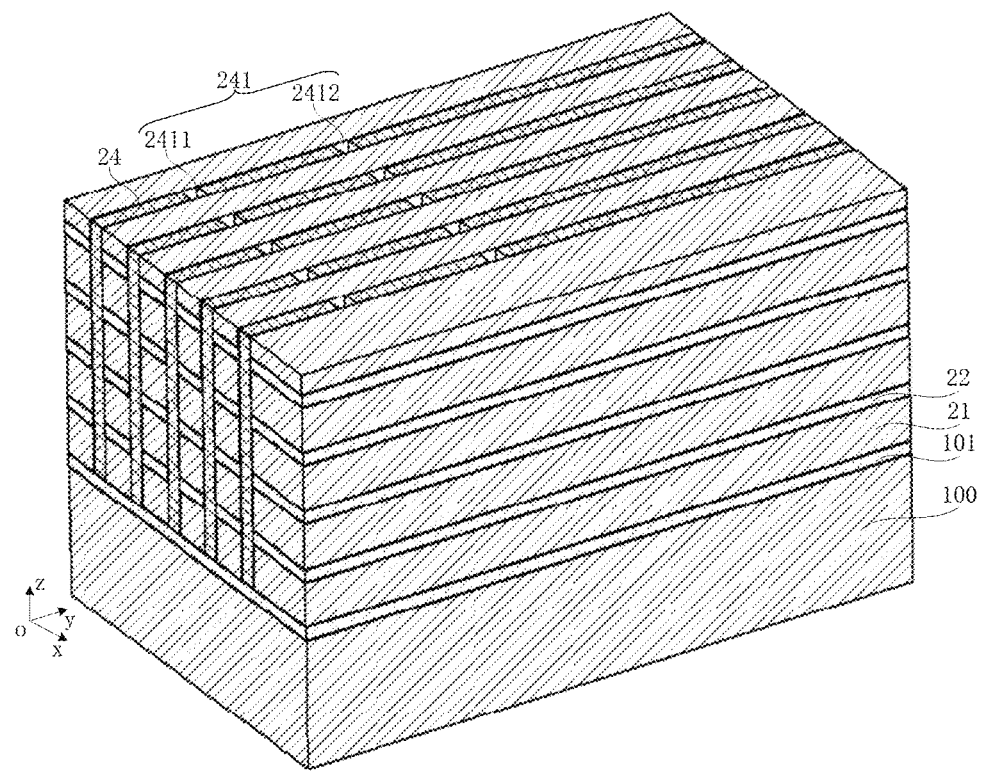
Figure 7B:
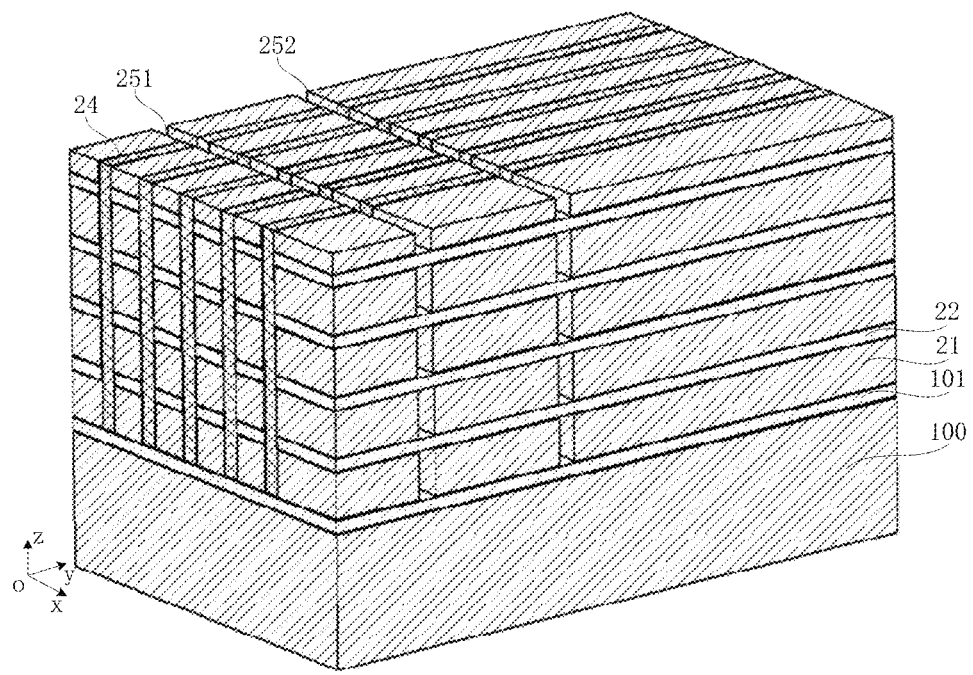

In some embodiments, please still referring to FIG. 7A and FIG. 7B, in step S1133, a first through hole 2411 and a second through hole 2412 isolated in the oy direction may be first provided on the isolation structure 24, and a corrosive solution may be injected via the first through hole 2411 and the second through hole 2412 for etching to form a first word line trench 251 and a second word line trench 252 that extend in the oz direction and are isolated from each other in the oy direction. The first word line trench 251 and the second word line trench 252 are configured to define shapes and positions of subsequently manufactured word line structures. The corrosive solution may be a BOE buffer etching solution. BOE is formed by mixing HF and NH4F in different ratios, for example, HF:NH4F=1:6. HF is a main etching solution, and NH4F is used as a buffer agent. The concentration of (H+) is fixed by using NH4F to maintain a certain etching rate, and silicon at a target position is etched and removed to form the first word line trench 251 and the second word line trench 252.

Figure 8:
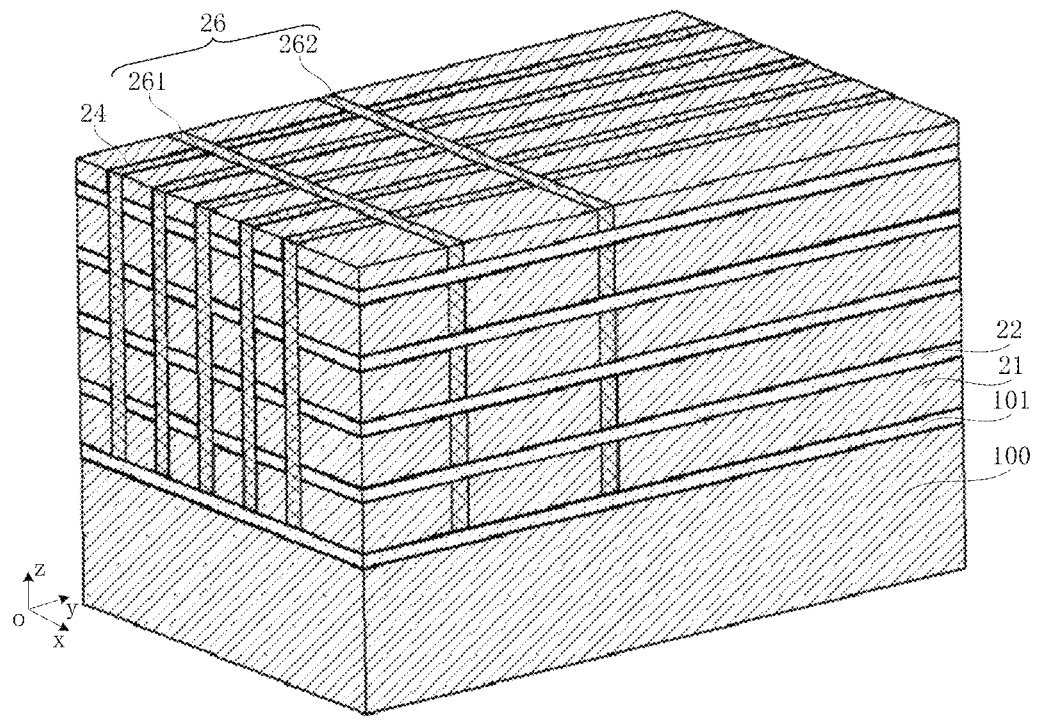
Figure 9:
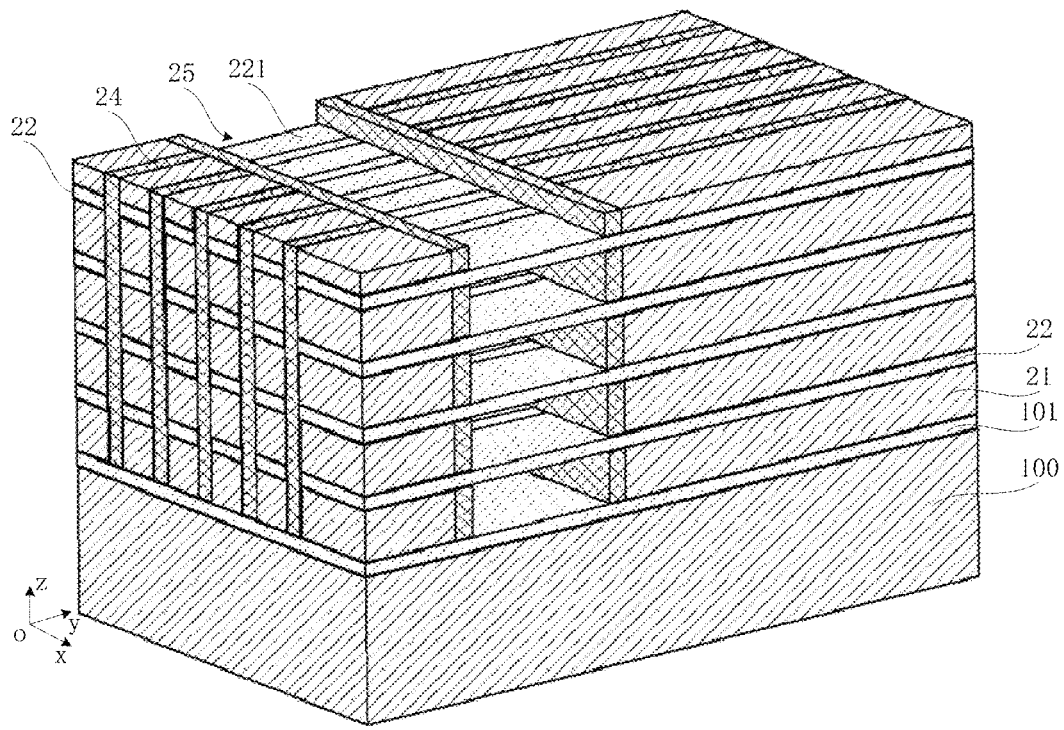

In some embodiments, please still referring to FIG. 8 and FIG. 9, a protective material is deposited in the first word line trench 251 and the second word line trench 252 to form a first protective side wall 261 in the first word line trench 251 and a second protective side wall 262 in the second word line trench 252, and parts of the initial channel layers 21 located between the first protective side wall 261 and the second protective side wall 262 may be removed by using a dry etching process, such that parts, located between the first protective side wall 261 and the second protective side wall 262, of the target semiconductor layers 22 are exposed and suspended to form the word line trench 25, and the first protective side wall 261 and the second protective side wall 262 form a protective layer 26 on side walls of the word line trench 25. The dry etching process includes, but is not limited to, one or more of reactive ion etching (RIE), inductively coupled plasma (ICP) etching, or high-concentration plasma (HDP) etching.

Figure 10:
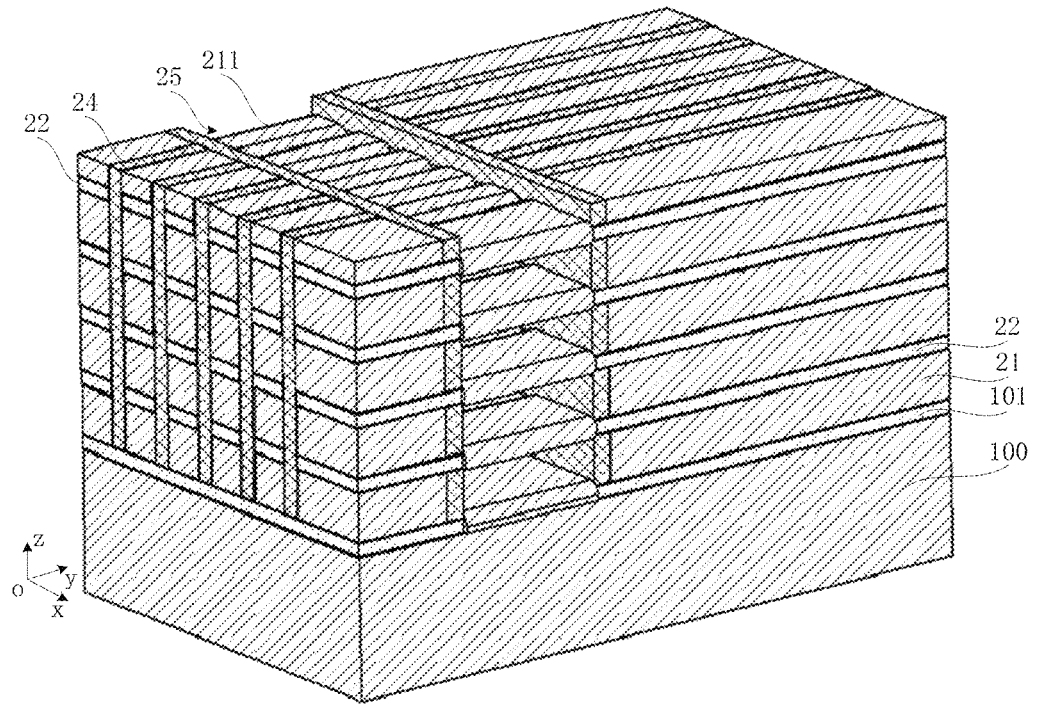

In some embodiments, please still referring to FIG. 9 and FIG. 10, in step S1134, the target semiconductor layers 22 exposed in the word line trench 25 may be oxidized in situ, and then an oxide formed in the in-situ oxidation period is removed, such that the target semiconductor layers 22 exposed in the word line trench 25 are rounded, and a rounded part of each of the target semiconductor layers 22 forms a first semiconductor pillar 221. Next, a first channel layer 211 may be formed on an outer surface of the first semiconductor pillar 221 by using a deposition process, and the first channel layer 211 surrounds the first semiconductor pillar 221. The first channel layer 211 is grown on the outer surface of the rounded first semiconductor pillar 221, such that the first channel layer 211 may be more uniform, and the doping concentration of the first channel layer 211 is conveniently controlled by an in-situ doping process to control the performance of subsequently manufactured word line structures. The deposition process may include, but is not limited to, one or more of a chemical vapor deposition (CVD), an atomic layer deposition (ALD) process, a high-density plasma (HDP) process, a plasma enhanced deposition process, and a spin-on dielectric (SOD) layer process. The first channel layer 211 may be a first-type doped layer, and the doping concentration range may be [1E14 cm-3, 1E18 cm-3]. For example, the doping concentration of the first channel layer 211 may be 1E14 cm-3, 1E15 cm-3, 1E16 cm-3, 1E17 cm-3, or 1E18 cm-3. The first-type doped layer may be P-type, and P-type impurity ions may include, but are not limited to, one or more of boron (B) ions, gallium (Ga) ions, boron fluoride ($BF_2$) ions, and indium (In) ions.

In some embodiments, please still referring to FIG. 3 and FIG. 11 to FIG. 13A, the first channel layer 211 includes a first-type doped layer. The process of forming a target laminated structure on the epitaxial layer 101 further includes:

Step S1136: fill a first dielectric layer 27 into the word line trench 25, an upper surface of the first dielectric layer 27 being flush with an upper surface of the initial laminated structure;

Step S1137: etch the initial laminated structure with the first dielectric layer 27 as a mask, such that a part, other than the first semiconductor pillar 221, of each of the target semiconductor layers 22 is suspended and exposed;

Step S1138: round an exposed part of each of the target semiconductor layers 22 and forming a second semiconductor pillar 222;

Step S1139: form a second-type doped layer, the second-type doped layer wrapping an outer surface of the second semiconductor pillar 222; and Step S11310: form an isolation material layer 28, and define a bit line trench Sb1 and a capacitor region Scap, laminated bit line structures being formed in the bit line trench Sb1, and laminated columnar capacitor structures being formed in the capacitor region Scap.

Figure 11:
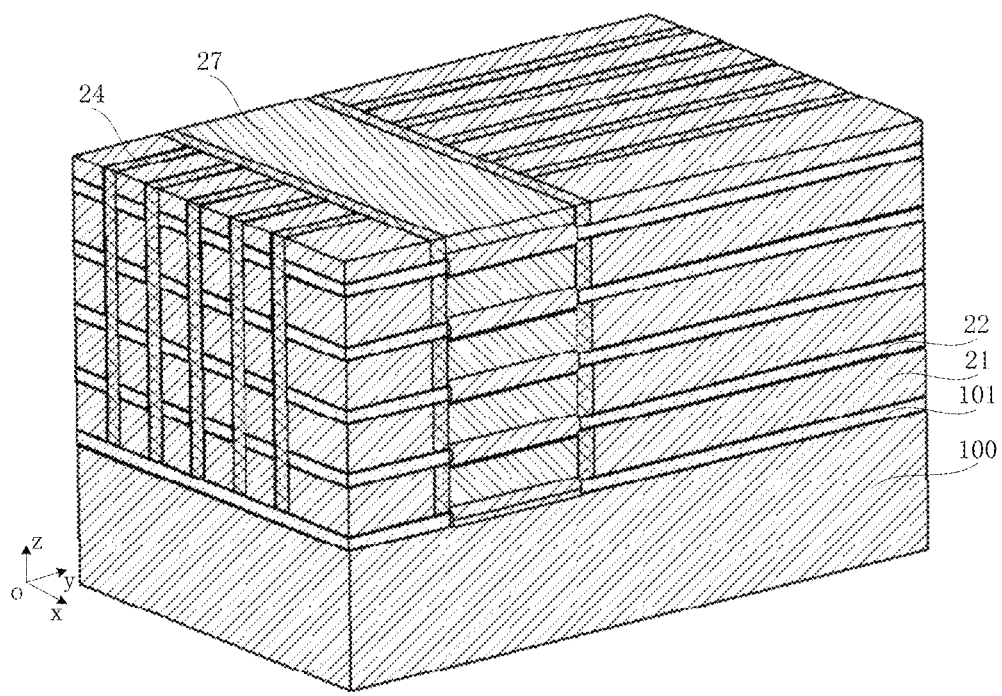

In some embodiments, please still referring to FIG. 11, in step S1136, the first dielectric layer 27 may be filled into the word line trench 25 by using one or more of an atomic layer deposition process, a plasma vapor deposition process, and a rapid thermal oxidation (RTO) process, and then the first dielectric layer 27 may be flattened by using a chemical mechanical polishing process, such that the upper surface of the first dielectric layer 27 is flush with the upper surface of the initial laminated structure. The first dielectric layer 27 is made of silicon dioxide.

Figure 12A:
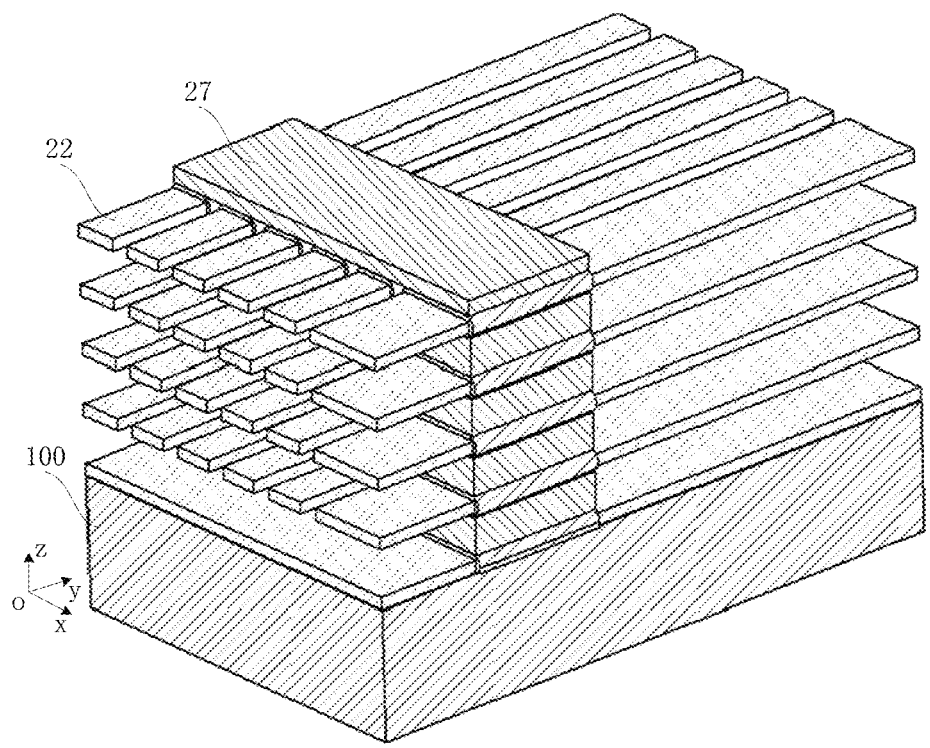

In some embodiments, please still referring to FIG. 12A, in step S1137, the initial laminated structure may be etched by using a dry etching process with the first dielectric layer 27 as a mask, such that a part, other than the first semiconductor pillar 221, of each of the target semiconductor layers 22 is suspended and exposed.

Figure 12B:
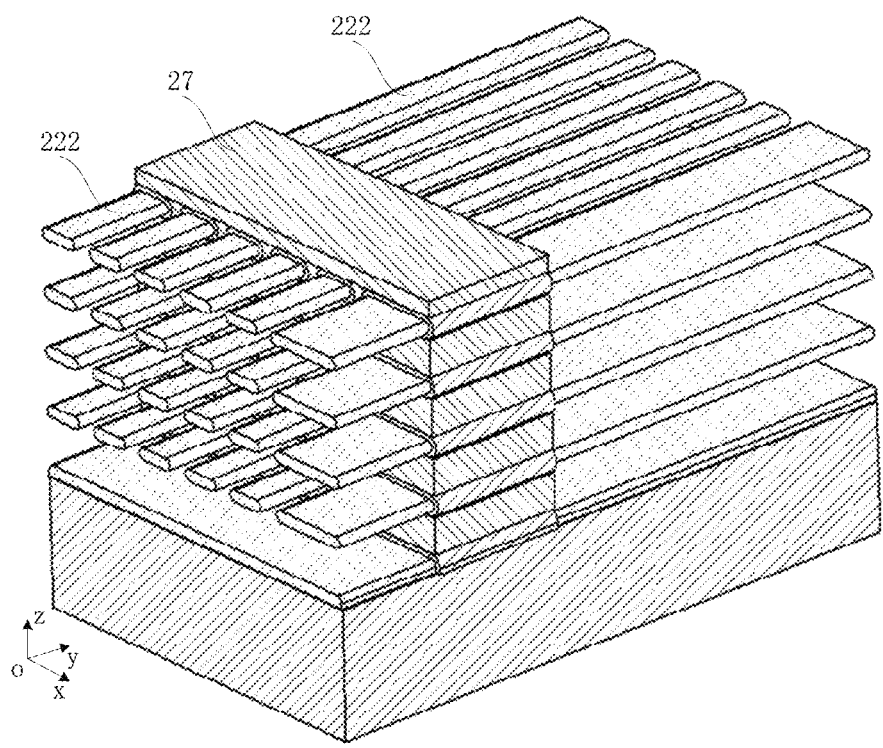

In some embodiments, please still referring to FIG. 12B, in step S1138, the suspended and exposed parts of the target semiconductor layers 22 may be oxidized in situ, and then an oxide formed in the in-situ oxidation period is removed, such that a part of each of the target semiconductor layers 22 outside the first dielectric layer 27 is rounded to form a second semiconductor pillar 222, and a channel layer subsequently formed on the outer side of the second semiconductor pillar 222 has good uniformity, thereby improving the performance and reliability of manufactured semiconductor products.

Figure 13A:
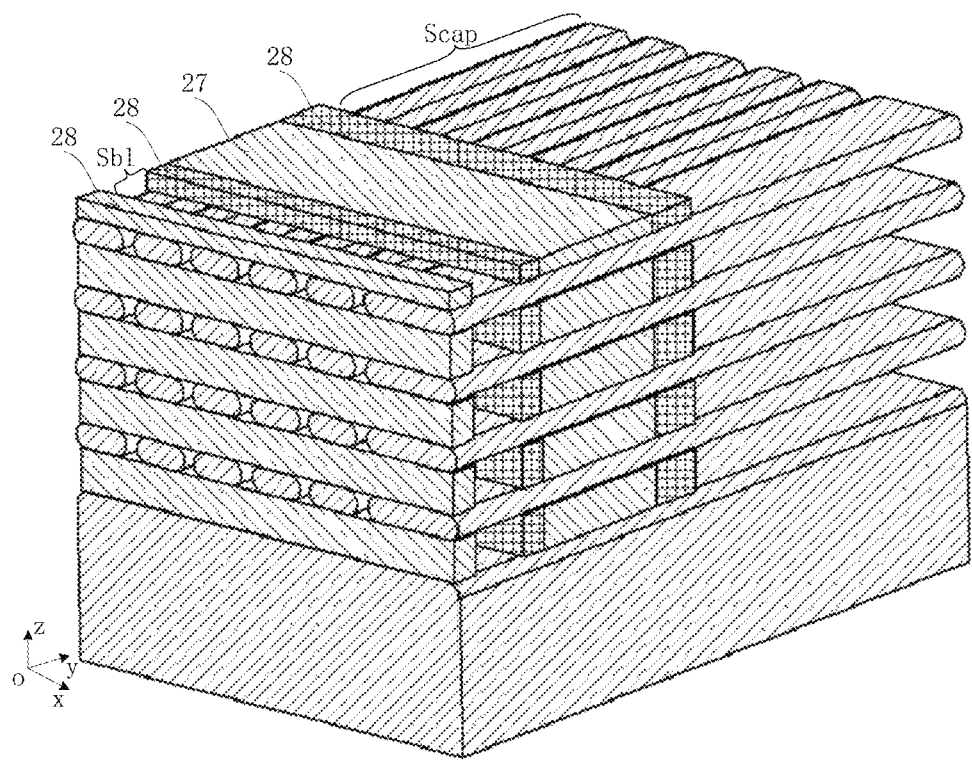

In some embodiments, please still referring to FIG. 13A, in step S1139, a second-type doped layer may be formed on the outer surface of the second semiconductor pillar 222 by using the deposition process, and the second-type doped layer wraps the outer surface of the second semiconductor pillar 222. In step S11310, the isolation material layer 28 may be formed by using the deposition process, the bit line trench Sb1 and the capacitor region Scap are defined, the second-type doped layers in the bit line trench Sb1 are exposed and suspended, and the laminated bit line structures are formed in the bit line trench Sb1. The second-type doped layers in the capacitor region Scap are exposed and suspended, and the laminated columnar capacitor structures are formed in the capacitor region Scap. The second-type doped layer has a doping concentration range of [1E18 cm-3, 1E21 cm-3]. For example, the second-type doped layer may have a doping concentration of 1E18 cm-3, 1E19 cm-3, 1E20 cm-3, or 1E21 cm-3. The second-type doped layer may be N-type, and N-type impurity ions may include, but are not limited to, one or several of phosphorus (P) ions, arsenic (As) ions, and antimony (Sb) ions. For example, the in-situ doping process may control the doping concentration of the second-type doped layer as [1E18 cm-3, 1E21 cm-3], such that the conductive impedance and the energy consumption of the epitaxial structure are reduced.

Figure 13B:
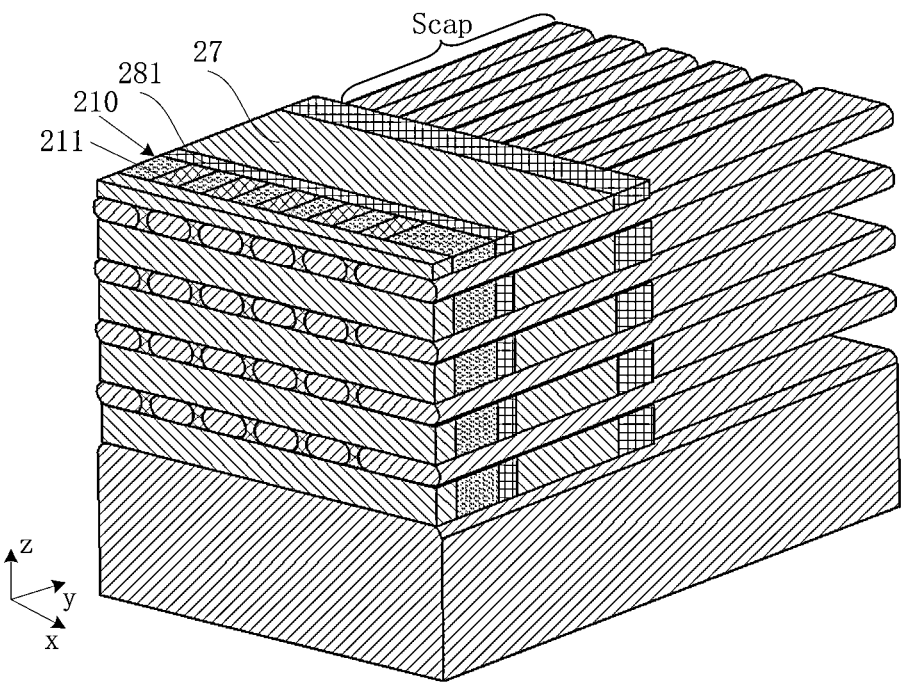

In some embodiments, please still referring to FIG. 13B, the isolation material layer 28 includes a first isolation material layer. After the bit line trench is defined, the method further includes:

Step S11311: deposit a bit line material layer in the bit line trench Sb1 to form bit line structures 210 laminated from bottom to top, the bit line structure 210 surrounding the second-type doped layer, the first isolation material layer being formed between the laminated bit line structures and the first dielectric layer 27, and the first isolation material layer forming a bit line protection structure 281.

In some embodiments, please still referring to FIG. 13B, in step S11311, the bit line material layer may be deposited in the bit line trench Sb1 by using the deposition process to form the bit line structures 210 laminated from bottom to top, and the bit line structure 210 surrounds the second-type doped layer. In the oz direction, and adjacent two of the bit line structures 210 are in ohmic contact. In the ox direction, adjacent two of the bit line structures 210 are insulated from each other, and a bit line protection structure 281 is formed between the laminated bit line structures 210 and the first dielectric layer 27 for electrically isolating the bit line structures 210 from the word line structures 40 in the oy direction. The bit line protection structure 281 may be made of silicon nitride or silicon oxynitride.

Figure 14:
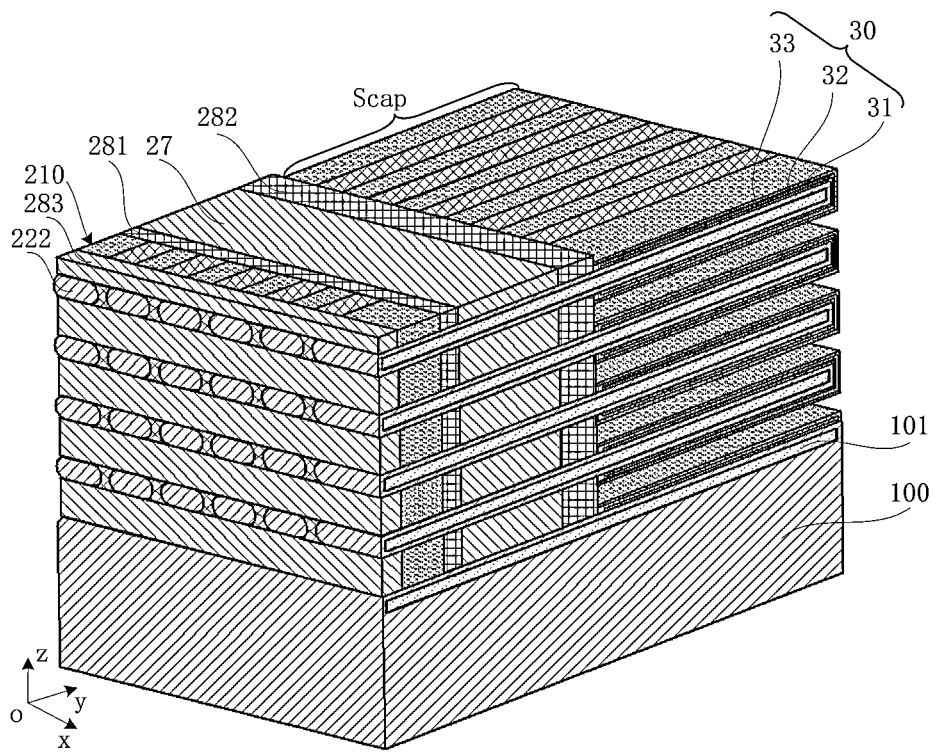

In some embodiments, please referring to FIG. 14, the isolation material layer 28 further includes a second isolation material layer. After the capacitor region Scap is defined, the method further includes:

Step S11312: form a first electrode layer 31, a high dielectric material layer 32, and a second electrode layer 33 sequentially laminated on an outer surface of each second-type doped layer in the capacitor region Scap to form columnar capacitor structures 30 laminated from bottom to top, the second isolation material layer being formed between the laminated columnar capacitor structures 30 and the first dielectric layer 27, and the second isolation material layer forming a capacitor isolation structure 282.

In some embodiments, please still referring to FIG. 14, in step S11312, the first electrode layer 31, the high dielectric material layer 32, and the second electrode layer 33 may be sequentially laminated on the outer surface of each second-type doped layer in the capacitor region Scap by using the deposition process, such that the first electrode layer 31, the high dielectric material layer 32, and the second electrode layer 33 in the capacitor region Scap form the columnar capacitor structure 30, and the capacitor isolation structure 282 is formed between the laminated columnar capacitor structures 30 and the first dielectric layer 27. In the ox direction, adjacent two of the columnar capacitor structures 30 are insulated from each other. In the oz direction, adjacent two of the columnar capacitor structures 30 are insulated from each other. The material of the first electrode layer 31 and the material of the second electrode layer 33 may be the same or different, and may be selected from one or more of cobalt (Co), nickel (Ni), titanium (Ti), tungsten (W), tantalum (Ta), tantalum titanium (TaTi), tungsten nitride (WN), copper (Cu), and aluminum (Al). The high dielectric material layer 32 may be formed by using the atomic layer deposition process or the plasma vapor deposition process, and may be made of silicon nitride and/or silicon oxynitride. The capacitor isolation structure 282 is configured to electrically isolate the word line structures 40 from the columnar capacitor structures 30 in the oy direction, and may be made of silicon nitride and/or silicon oxynitride.

Figure 15A:
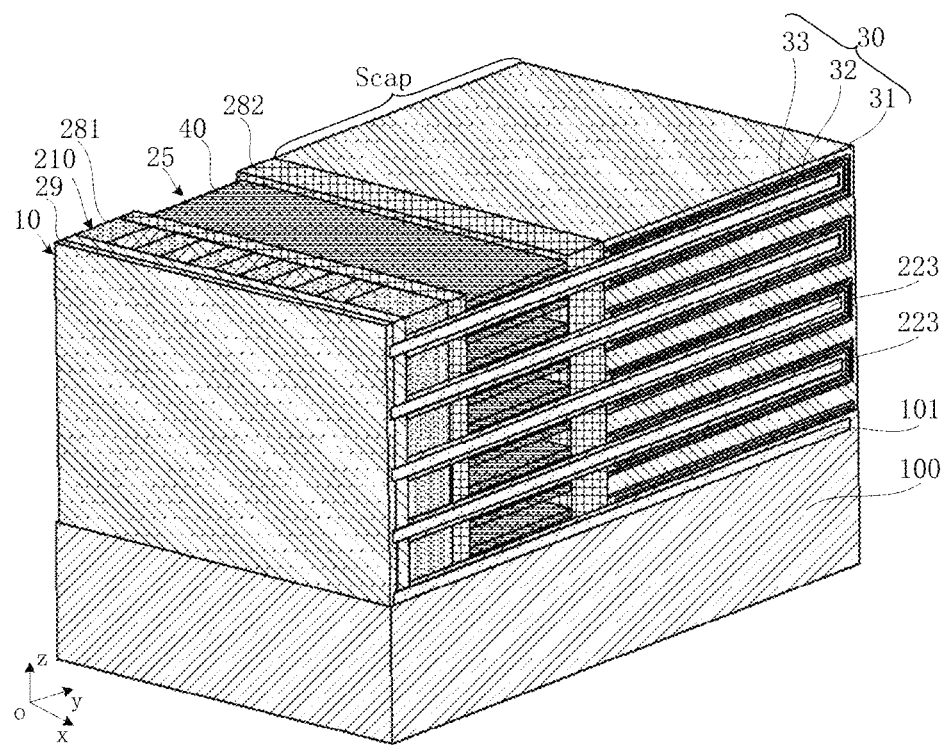
Figure 15B:
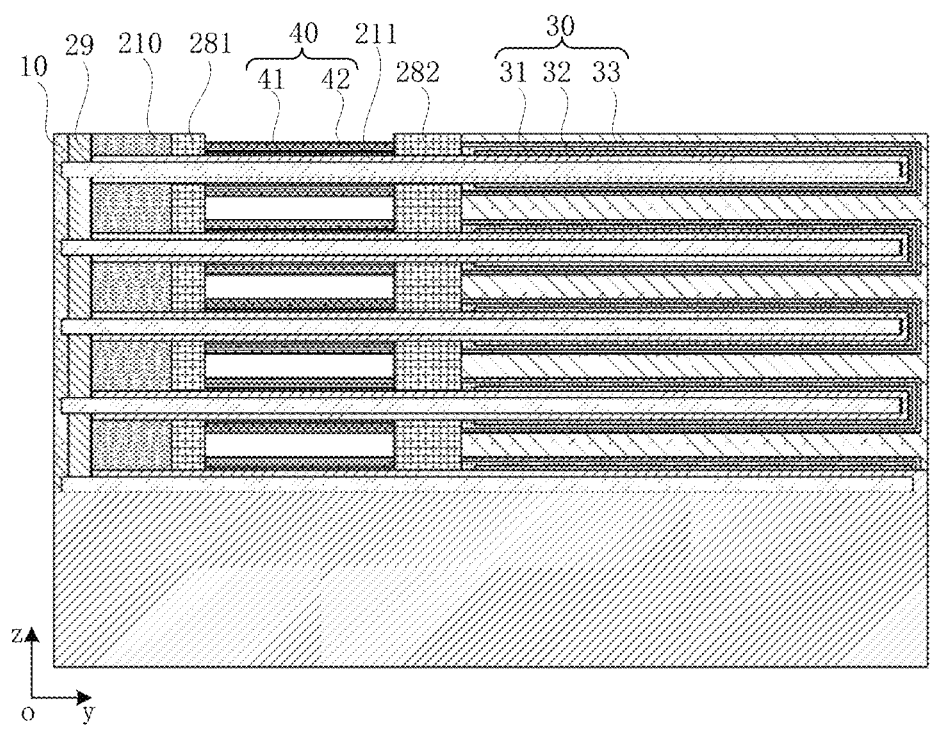

In some embodiments, please still referring to FIG. 14 to FIG. 15B, the isolation material layer further includes a third isolation material layer 283. The third isolation material layer 283 is formed on a side of the laminated bit line structures 210 distant from the first dielectric layer 27. The process of forming a target laminated structure on the epitaxial layer 101 further includes:

Step S11313: etch the third isolation material layer 283, such that parts of the second semiconductor pillars 222 at a side distant from the capacitor region Scap in the first direction are exposed and suspended;

Step S11314: form a bit line isolation structure 29 on the exposed parts of the second semiconductor pillars 222, and define a grounding electrode region; and Step S11315: form a conductive material layer in the grounding electrode region to form grounding structures 10 laminated from bottom to top, each of the grounding structures 10 wrapping an end of one of the target semiconductor layers 22 distant from the capacitor region Scap in the first direction.

In some embodiments, please still referring to FIG. 14 to FIG. 15B, in step S11313, a part of the third isolation material layer 283 may be removed by using an etching process, such that the parts of the second semiconductor pillars 222 at the side distant from the capacitor region Scap in the oy direction are exposed and suspended. Then, in step S11314, the bit line isolation structure 29 may be formed on the exposed parts of the second semiconductor pillars 222 by using the deposition process, and the grounding electrode region is defined. To ensure the isolation effect, the length of the bit line isolation structure 29 in the oy direction may be set as [5 nm, 50 nm]. For example, the length of the bit line isolation structure 29 in the oy direction may be 5 nm, 15 nm, 25 nm, 35 nm, 45 nm, or 50 nm. If the bit line isolation structure 29 in the oy direction is too short, the isolation effect is likely to be deteriorated. On the contrary, if the bit line isolation structure 29 in the oy direction is too long, the volume of products is likely to increase. In step S11315, the conductive material layer may be formed in the grounding electrode region by using the deposition process to form the grounding structures 10 laminated from bottom to top, each of the grounding structures 10 wraps an end of one of the target semiconductor layers 22 distant from the capacitor region Scap in the oy direction. In the oz direction, adjacent two of the grounding structures 10 are electrically connected to each other. The etching process may include, but is not limited to, one or more of reactive ion etching (RIE), inductively coupled plasma (ICP) etching, or high-concentration plasma (HDP) etching. The deposition process may include, but is not limited to, one or more of a chemical vapor deposition (CVD), an atomic layer deposition (ALD) process, a high-density plasma (HDP) process, a plasma enhanced deposition process, and a spin-on dielectric (SOD) layer process.

In some embodiments, please still referring to FIG. 15A and FIG. 15B, the process of forming a target laminated structure on the epitaxial layer 101 further includes:

Step S11316: remove a first dielectric layer 27, such that the first channel layers 211 in the word line trench 25 are exposed and suspended; and Step S11317: form a word line structure 40 on the outer surface of each of the first channel layers 211, the word line structure 40 surrounding the first channel layer 211, where adjacent two of the word line structures 40 are insulated from each other in a direction perpendicular to the upper surface of the substrate 100, such as oz direction.

In some embodiments, please still referring to FIGS. 15A and 15b, in step S11316, the first dielectric layer 27 may be removed by using the etching process, such that the first channel layers 211 in the word line trench are exposed and suspended. In step S11317, a gate oxide layer 41 may be formed on the outer surface of each of the first channel layers 211 by using the atomic layer deposition process, the plasma vapor deposition process, or the rapid thermal oxidation (RTO) process, and then a gate metal layer 42 is deposited on the outer surface of each gate oxide layer 41 by using the deposition process to form the word line structure 40. The gate oxide layer 41 surrounds the first channel layer 211; and the gate metal layer 42 surrounds the gate oxide layer 41. In the direction perpendicular to the upper surface of the substrate 100, such as the oz direction, adjacent two of the word line structures 40 are insulated from each other, so as to subsequently select a required word line. In the ox direction, adjacent two of the word line structures 40 are in ohmic contact. The gate oxide layer 41 may be made of a material with a high-k dielectric constant. For example, the gate oxide layer 41 may be made of a material with a high-k dielectric constant. For example, the material of the gate oxide layer 41 may include, but is not limited to, one or more of aluminum oxide ($Al_2O_3$), hafnium oxide ($HfO_2$), hafnium oxide nitrogen (HfON), zirconium oxide ($ZrO_2$), tantalum oxide ($Ta_2O_5$), titanium oxide ($TiO_2$), or strontium titanium oxide ($SrTiO_3$). The gate metal layer 42 may include, but is not limited to, any one or several of titanium nitride (TiN), titanium (Ti), tungsten silicide ($Si_2W$), and tungsten (W), etc.

It should be understood that although the steps in the flowchart of FIG. 3 are sequentially displayed according to the arrows, these steps are not necessarily executed in the order indicated by the arrows. Unless clearly described otherwise, the execution order of the steps is not strictly limited, and these steps may be executed in other orders. Moreover, at least some of the steps in FIG. 3 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

In some embodiments, please still referring to FIG. 15A and FIG. 15B, a memory structure is provided. The memory structure includes: a substrate 100, a first-type doped well region (not shown in the drawing) being formed in the substrate 100; an epitaxial layer 101 covering the first-type doped well region; and a target laminated structure located on the epitaxial layer 101. The target laminated structure includes a plurality of laminated semiconductor structures according to any embodiment of the present disclosure, and word line structures in adjacent two of the semiconductor structures are insulated from each other in a direction perpendicular to the substrate 100, such as oz direction. By sequentially arranging the grounding structure 10, the bit line structure 210, the word line structure 40, and the columnar capacitor structure 30 on the epitaxial structure in the oy direction, a shared epitaxial structure is grounded to prevent charges from accumulating in the epitaxial structure to produce a floating body effect, thereby improving the performance and reliability of semiconductor products.

In some embodiments, a cross section of the epitaxial structure intersecting with the first direction is in a rounded shape. For example, a cross section of the epitaxial structure perpendicular to the oy direction is in a rounded shape. The rounded shape includes at least one of a rounded rectangle, an ellipse, a rounded polygon, and a circle, and prevents a contact surface of the epitaxial structure with any one of the grounding structure 10, the bit line structure 210, the word line structure 40, and the columnar capacitor structure 30 formed on the epitaxial structure from having a sharp corner to induce a tip discharge/leakage phenomenon, thereby improving the performance and reliability of manufactured products.

It may be noted that the foregoing embodiments are merely for the purpose of description instead of limiting the present disclosure.

The embodiments of this specification are described in a progressive manner, and each embodiment focuses on differences from other embodiments. The same or similar parts between the embodiments may refer to each other.

The technical characteristics of the above embodiments can be employed in arbitrary combinations. To provide a concise description of these embodiments, all possible combinations of all the technical characteristics of the above embodiments may not be described; however, these combinations of the technical characteristics should be construed as falling within the scope defined by the specification as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A semiconductor structure, comprising:
  an epitaxial structure;
  a grounding structure, wrapping one end of the epitaxial structure in a first direction;
  a columnar capacitor structure, wrapping the other end of the epitaxial structure in the first direction;
  a bit line structure, surrounding the epitaxial structure and located between the grounding structure and the columnar capacitor structure; and
  a word line structure, surrounding the epitaxial structure and located between the bit line structure and the columnar capacitor structure;
  wherein a part of the epitaxial structure covered by the word line structure comprises:
  a first semiconductor pillar, extending in the first direction and provided with a cross section, intersecting with the first direction, being in a rounded shape; and
  a first channel layer, surrounding the first semiconductor pillar and located between the word line structure and the first semiconductor pillar;
  wherein the first channel layer comprises a first-type doped layer; and a part of the epitaxial structure covered by the bit line structure and a part of the epitaxial structure covered by the columnar capacitor structure each comprise:
- a second semiconductor pillar, extending in the first direction and provided with a cross section, intersecting with the first direction, being in a rounded shape; and
- a second-type doped layer, comprising a first part located between the second semiconductor pillar and the bit line structure, and a second part located between the second semiconductor pillar and the columnar capacitor structure;
- wherein the first semiconductor pillar and the second semiconductor pillar are made of germanium-silicon; and
- the first channel layer and the second-type doped layer are made of silicon.

2. The semiconductor structure according to claim 1, wherein a cross section of the epitaxial structure intersecting with the first direction is in a rounded shape.

3. The semiconductor structure according to claim 1, wherein
- the first-type doped layer has a doping concentration range of [1E14 cm-3, 1E18 cm-3]; and/or
- the second-type doped layer has a doping concentration range of [1E18 cm-3, 1E21 cm-3].

4. The semiconductor structure according to claim 1, wherein a part of the epitaxial structure covered by the word line structure has a thickness of [30 nm, 80 nm].

5. The semiconductor structure according to claim 1, further comprising at least one of the following structures:
- a bit line protection structure, located between the bit line structure and the word line structure;
- a capacitor isolation structure, located between the word line structure and the columnar capacitor structure; and
- a bit line isolation structure, surrounding the epitaxial structure and located between the grounding structure and the bit line structure.

6. The semiconductor structure according to claim 1, wherein the grounding structure is made of a metal conductive material and/or a non-metal conductive material; and/or
- the bit line structure is made of a metal conductive material.

7. A memory structure, comprising:
- a substrate, a first-type doped well region being formed in the substrate;
- an epitaxial layer, covering the first-type doped well region; and
- a target laminated structure, located on the epitaxial layer;
- wherein, the target laminated structure comprises a plurality of laminated semiconductor structures according to claim 1, and word line structures are in adjacent two of the semiconductor structures are insulated from each other in a direction perpendicular to an upper surface of the substrate.

8. A method of manufacturing a memory structure, comprising:
- providing a substrate, a first-type doped well region being formed in the substrate;
- forming an epitaxial layer on the substrate, the epitaxial layer covering the first-type doped well region; and
- forming a target laminated structure on the epitaxial layer, the target laminated structure comprising a plurality of semiconductor structures laminated in a thickness direction according to claim 1.

9. The method according to claim 8, wherein the forming a target laminated structure on the epitaxial layer comprises:
- forming an initial laminated structure on the epitaxial layer, the initial laminated structure comprising initial channel layers and target semiconductor layers alternately laminated in sequence from bottom to top;
- forming a plurality of isolation structures, extending in a first direction and arranged at intervals in a second direction, in the initial laminated structure, bottoms of the isolation structures being in contact with an upper surface of the epitaxial layer;
- forming a word line trench extending in the second direction, side walls of the word line trench being covered by a protective layer, the word line trench exposing the upper surface of the epitaxial layer, and parts, located in the word line trench, of the target semiconductor layers being suspended and exposed;
- removing an oxide formed in an in-situ oxidation period after the target semiconductor layers exposed in the word line trench are oxidized in situ, such that the target semiconductor layers exposed in the word line trench are rounded, a rounded part of each of the target semiconductor layers forming a first semiconductor pillar; and
- forming a first channel layer on an outer surface of the first semiconductor pillar, the first channel layer surrounding the first semiconductor pillar.

10. The method according to claim 9, wherein the first channel layer comprises a first-type doped layer; and the forming a target laminated structure on the epitaxial layer further comprises:
- filling a first dielectric layer into the word line trench, an upper surface of the first dielectric layer being flush with an upper surface of the initial laminated structure;
- etching the initial laminated structure with the first dielectric layer as a mask, such that a part, other than the first semiconductor pillar, of each of the target semiconductor layers is suspended and exposed;
- rounding an exposed part of each of the target semiconductor layers, and forming a second semiconductor pillar;
- forming a second-type doped layer, the second-type doped layer wrapping an outer surface of the second semiconductor pillar; and
- forming an isolation material layer, and defining a bit line trench and a capacitor region, laminated bit line structures being formed in the bit line trench, and laminated columnar capacitor structures being formed in the capacitor region.

11. The method according to claim 10, wherein the isolation material layer comprises a first isolation material layer; and after the bit line trench is defined, the method further comprises:
- depositing a bit line material layer in the bit line trench to form the bit line structures laminated from bottom to top, the bit line structure surrounding the second-type doped layer, the first isolation material layer being formed between the laminated bit line structures and the first dielectric layer, and the first isolation material layer forming a bit line protection structure.

12. The method according to claim 10, wherein the isolation material layer comprises a second isolation material layer; and after the capacitor region is defined, the method further comprises:
- forming a first electrode layer, a high dielectric material layer, and a second electrode layer sequentially laminated on an outer surface of each second-type doped layer in the capacitor region, to form the columnar capacitor structures laminated from bottom to top, the second isolation material layer being formed between the laminated columnar capacitor structures and the first dielectric layer, and the second isolation material layer forming a capacitor isolation structure.

13. The method according to claim 11, wherein the isolation material layer comprises a third isolation material layer, and the third isolation material layer is formed on a side of the laminated bit line structures distant from the first dielectric layer; and the forming a target laminated structure on the epitaxial layer further comprises:
   etching the third isolation material layer, such that parts of the second semiconductor pillars at a side distant from the capacitor region in the first direction are exposed and suspended;
   forming a bit line isolation structure on the exposed parts of the second semiconductor pillars, and defining a grounding electrode region; and
   forming a conductive material layer in the grounding electrode region to form grounding structures laminated from bottom to top, each of the grounding structures wrapping an end of one of the target semiconductor layers distant from the capacitor region in the first direction.

14. The method according to claim 13, wherein the forming a target laminated structure on the epitaxial layer further comprises:
   removing the first dielectric layer, such that the first channel layers in the word line trench are exposed and suspended; and
   forming a word line structure on an outer surface of each of the first channel layers, the word line structure surrounding the first channel layer, wherein adjacent two of the word line structures are insulated from each other in a direction perpendicular to an upper surface of the substrate.

15. The method according to claim 10, wherein
the first-type doped layer has a doping concentration range of [1E14 cm-3, 1E18 cm-3]; and/or
the second-type doped layer has a doping concentration range of [1E18 cm-3, 1E21 cm-3].

\* \* \* \* \*